United States Patent
Shizukuishi

(10) Patent No.: US 7,863,659 B2
(45) Date of Patent: Jan. 4, 2011

(54) MOS TYPE SOLID-STATE IMAGE PICKUP APPARATUS WITH WIRING LAYERS OF DIFFERENT LINE-WIDTH AND THICKNESS

(75) Inventor: Makoto Shizukuishi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 782 days.

(21) Appl. No.: 11/515,008

(22) Filed: Sep. 5, 2006

(65) Prior Publication Data
US 2007/0080419 A1 Apr. 12, 2007

(30) Foreign Application Priority Data
Sep. 14, 2005 (JP) .......................... P.2005-267236

(51) Int. Cl.
*H01L 27/00* (2006.01)
(52) U.S. Cl. ............... 257/291; 257/292; 257/443; 257/E27.133
(58) Field of Classification Search ............. 257/291, 257/292, 294, 443, 461, 462
See application file for complete search history.

(56) References Cited

U.S. PATENT DOCUMENTS

| 7,030,918 | B1 | 4/2006 | Nakashiba | |
| 7,361,525 | B2* | 4/2008 | Okada et al. | 438/57 |
| 7,474,002 | B2* | 1/2009 | Ishikawa | 257/776 |
| 7,492,047 | B2* | 2/2009 | Ohkawa | 257/774 |
| 2004/0105022 | A1* | 6/2004 | Hirayama et al. | 348/272 |
| 2004/0113180 | A1* | 6/2004 | Yamaguchi et al. | 257/225 |
| 2004/0130757 | A1* | 7/2004 | Mabuchi | 358/482 |
| 2004/0132262 | A1* | 7/2004 | Ayabe et al. | 438/428 |
| 2004/0252212 | A1* | 12/2004 | Ohkawa | 348/308 |
| 2006/0049476 | A1* | 3/2006 | Koizumi et al. | 257/432 |

FOREIGN PATENT DOCUMENTS

| JP | 10-93067 | 4/1998 |
| JP | 2001-15725 | 1/2001 |
| JP | 2001-298176 A | 10/2001 |
| JP | 2003/264281 | 9/2003 |
| WO | 2004/097930 A1 | 11/2004 |

OTHER PUBLICATIONS

Japanese Notification of Reasons for Refusal, Aug. 24, 2010.

* cited by examiner

*Primary Examiner*—Wael M Fahmy
*Assistant Examiner*—Abul Kalam
(74) *Attorney, Agent, or Firm*—Birch, Stewart, Kolasch & Birch, LLP

(57) ABSTRACT

A MOS type solid-state image pickup apparatus comprises: a semiconductor substrate having a light receiving surface; a plurality of photoelectric conversion elements arranged in an array manner on the light receiving surface; a plurality of layers of wirings that goes across the light receiving surface and are stacked above the semiconductor substrate, the wirings being connected to signal reading circuits each of which is provided in association with each of the photoelectric conversion elements; and an insulation layer interposed with the layers of wirings, wherein a first wiring, which connects to a gate of a MOS transistor forming a part of each of the signal reading circuits, is provided in a lower one of the layers of wirings, and a second wiring, which connects to a source or drain of the MOS transistor, is provided in an upper one of the layers of wirings.

12 Claims, 8 Drawing Sheets

MOS TYPE SOLID-STATE IMAGE PICKUP APPARATUS WITH WIRING LAYERS OF DIFFERENT LINE-WIDTH AND THICKNESS

BACKGROUND OF THE INVENTION

1. Field of the Invention

The present invention relates to a MOS type solid-state image pickup apparatus and a method of manufacturing the same and, more particularly, to a MOS type solid-state image pickup apparatus capable of picking up an image of high quality and a method of manufacturing the same.

2. Description of the Related Art

FIG. 6A is a schematic view of a surface of a CMOS image sensor 1 constituted by a plurality of photodiodes (photoelectric conversion elements) arranged in the form of a square grid on a light-receiving surface (image area) of a semiconductor substrate. FIG. 6B is a circuit diagram of the same. In the illustrated image sensor 1, a multiplicity of unit pixels 3 are arranged on a light-receiving surface 2; a control pulse generating circuit 4 and a vertical scanning circuit 5 are formed on a side of the light-receiving surface 2; and a noise suppression circuit 6 and a horizontal scanning circuit 7 are formed along a lower edge of the light-receiving surface 2.

Characters R, G, and B shown on the unit pixels 3 in FIG. 6A indicate red filters (R), green filters (G), and blue filters (B) formed on the photodiodes constituting the unit pixels.

A unit pixel 3 is constituted by a photodiode 3a (see FIG. 6B) and a signal reading circuit for reading a signal detected by the photodiode 3a (although the circuit is shown in FIG. 6B as a known signal reading circuit constituted by four transistors, a configuration including three transistors may alternatively be used).

Wirings 10 extending in an X-direction (horizontal direction) and wirings 11 extending in a Y-direction (vertical direction) are laid on the light-receiving surface 2 of the CMOS image sensor 1. The wirings 10 are connected to the control pulse generating circuit 4 and the vertical scanning circuit 5, and the wirings 11 are connected to the noise suppression circuit 6, the horizontal scanning circuit 7, and a power supply which is not shown.

The wirings 10 and 11 laid on the light-receiving surface 2 in the X- and Y-direction will be hereinafter referred to as "global wirings" to distinguish them from, for example, internal wirings of a signal reading circuit and internal wirings of the control pulse generating circuit 4, the vertical scanning circuit 5, the noise suppression circuit 6, and the horizontal scanning circuit 7. The global wirings include a row select line, a row reset line, a power supply line, and output signal line, and they are formed from a metal such as aluminum or copper, in general.

It is said that the manufacturing cost of such a CMOS image sensor 1 according to the related is low because it can be manufactured using general CMOS processes (DRAM processes) unlike a CCD image sensor for which dedicated manufacturing processes are used.

The reason is that a part (p-n junction) of a MOS transistor manufactured in the same way as other CMOS-LSIs is used as the photodiode 3a of the CMOS image sensor 1 and that a signal reading circuit for reading a signal from the photodiode 3a is also constructed as a combination of a plurality of MOS transistors.

A photodiode must be selected from among the photodiodes 3a to read a signal from the same, and such selection can be made through the global wirings 10 connected to the signal reading circuit of each photodiode just like the selection of a memory element such as a DRAM.

FIG. 7A is a schematic perspective view of one unit pixel of the CMOS image sensor, and FIG. 7B is a schematic view of a section of the same. Visible light rays 15 enter each unit pixel from the outside through a micro-lens (top lens) 16 and a color filter layer 17, and the light reaches the photodiode 3a.

At this time, when the global wiring 10 extending in the X-direction and the global wiring 11 extending in the Y-direction block a part of the incident light, multiple reflection of the part of the incident light occurs between the global wirings 10 and 11 or between the wirings and a metal film (shield film which is normally an aluminum thin film) for shielding the signal reading circuit 18 (see FIG. 7A) except the photodiode 3a from light. When resultant multiple reflection light 20 leaks into an adjacent photodiode 3a, a problem arises in that an image thus picked up has low quality.

The photodiode 3a formed on the semiconductor substrate is separated from a MOS transistor constituting a signal reading circuit for selecting and amplifying a signal by a device separating region 21. At a CMOS process, a gate electrode 22 forming a part of the MOS transistor is formed in the device separating region 21; a leveling protective film 23 is formed on the electrode; and a first wiring layer which is a metal film such as aluminum is formed thereafter.

Let us assume that the first wiring layer is the global wiring 10 extending in the X-direction. Then, it is required to form a leveled insulation film further on the global wiring 10 in the X-direction such that the global wiring 11 in the Y-direction and the global wiring 10 will not cross and electrically short with each other and to form the global wiring 11 in the Y-direction on the film.

Normally, another leveling film is formed on the wiring and a shielding layer 19 is formed thereon. Further, another leveling film is formed on the layer and a color filter layer 17 is formed thereon. As thus described, global wirings are generally formed in a multi-layer structure at a CMOS process.

Referring to the material of the global wirings, a low-resistance metal material such as Al (aluminum) is normally used to ensure that a resultant integrated circuit (IC) operates at a high speed. However, the use of aluminum makes it difficult to solve the above-mentioned problem of multiple reflections because it has a high surface reflectivity.

For example, techniques associated with CMOS image sensors in the related art include that disclosed in JP-A-2001-298176.

A MOS image sensor (MOS type solid-state image pickup apparatus) is constructed by forming wiring layers in a multi-layer structure on a semiconductor substrate having photodiodes and signal reading circuits formed thereon and forming optical layers such as color filters and micro-lenses on the wiring layers. The recent progress in micro-processing techniques has resulted in a trend toward image sensors having a greater number of pixels (a higher pixel density). Thus, the dimensions of the aperture of one pixel are becoming smaller, and the distance between adjoining pixels is also becoming smaller. On the contrary, efforts toward the reduction of the height of pixels have been unsuccessful, and an optical path traveled by light incident on a micro-lens of each pixel to reach a photodiode is becoming longer and narrower. The effect of multiple reflections is thus becoming no longer ignorable as the trend toward image sensors with a greater number of pixels proceeds.

SUMMARY OF THE INVENTION

It is an object of the invention to provide a MOS type solid-state image pickup apparatus capable of picking up an image of high quality by suppressing multiple reflections of incident light attributable to global wirings and to provide a method of manufacturing the same.

The invention provides a MOS type solid-state image pickup apparatus comprising: a semiconductor substrate having a light receiving surface; a plurality of photoelectric conversion elements arranged in an array manner on the light receiving surface; a plurality of layers of wirings that goes across the light receiving surface and are stacked above the semiconductor substrate, the wirings being connected to signal reading circuits each of which is provided in association with each of the photoelectric conversion elements; and an insulation layer interposed with the layers of wirings, wherein a first wiring, which connects to a gate of a MOS transistor forming a part of each of the signal reading circuits, is provided in a lower one of the layers of wirings, and a second wiring, which connects to a source or drain of the MOS transistor, is provided in an upper one of the layers of wirings.

According to the invention, there is provided the MOS type solid-state image pickup apparatus, wherein the first wiring has a greater line width and a smaller thickness compared to the second wiring.

According to the invention, there is provided the MOS type solid-state image pickup apparatus, wherein a sectional shape of the second wiring taken in a direction perpendicular to a longitudinal direction of the second wiring is vertically elongated when the vertical direction is a direction extending upward from the semiconductor substrate.

The invention provides a MOS type solid-state image pickup apparatus comprising: a semiconductor substrate having a light receiving surface; a plurality of photoelectric conversion elements arranged in an array manner on the light receiving surface; a plurality of layers of wirings that goes across the light receiving surface and are stacked above the semiconductor substrate; and an insulation layer interposed with the layers of wirings, wherein a first wiring in a lower one of the layers of wirings has a greater line width and a smaller thickness compared to a second wiring in an upper one of the layers of wirings.

According to the invention, there is provided the MOS type solid-state image pickup apparatus, wherein a sectional shape of the second wiring taken in a direction perpendicular to a longitudinal direction of the second wiring is vertically elongated when the vertical direction is a direction extending upward from the semiconductor substrate.

According to the invention, there is provided the MOS type solid-state image pickup apparatus, wherein the wirings are connected to signal reading circuits each of which is provided in association with each of the photoelectric conversion elements, the first wiring connects to a gate of a MOS transistor forming a part of each of the signal reading circuits, and the second wiring connects to a source or drain of the MOS transistor.

According to the invention, there is provided the MOS type solid-state image pickup apparatus, wherein a specific resistance per unit length of the second wiring is lower than a specific resistance per unit length of the first wiring.

According to the invention, there is provided the MOS type solid-state image pickup apparatus, wherein a material of the second wiring is Al or a compound including Al.

According to the invention, there is provided the MOS type solid-state image pickup apparatus, wherein a material of the first wiring is Cu or a compound including Cu.

The invention provides a method of manufacturing any of the MOS type solid-state image pickup apparatus described above, comprising: leveling a surface of the first wiring using a CMP method after forming the first wiring; and then forming the second wiring.

DETAILED DESCRIPTION OF THE INVENTION

An embodiment of the invention will now be described with reference to the drawings.

Figure 1:
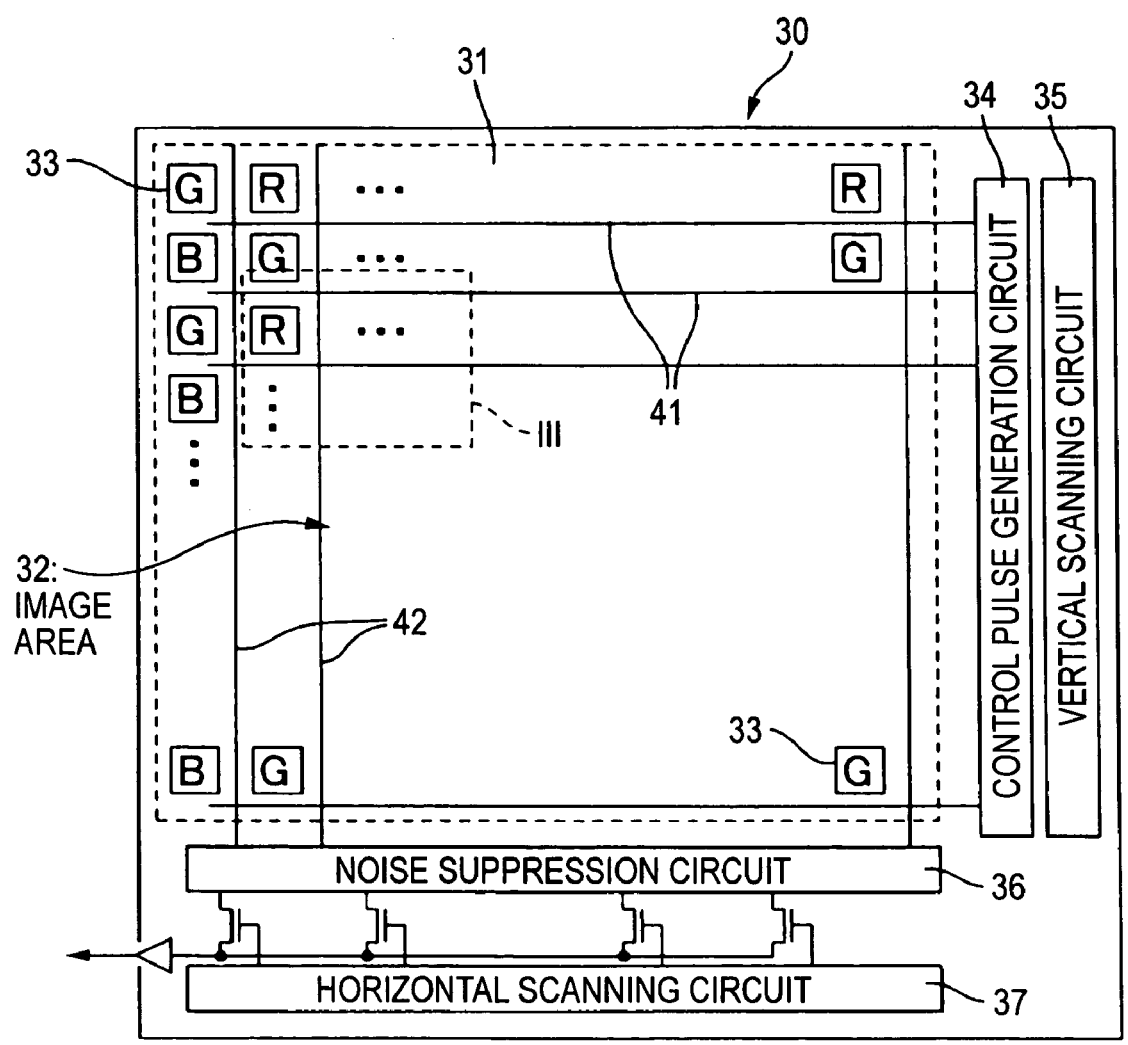
FIG. 1 is a schematic plan view of a MOS type solid-state image pickup apparatus according to an embodiment of the invention.

FIG. 1 is a schematic plan view of a MOS type solid-state image pickup apparatus 30 to be mounted in a digital camera according to an embodiment of the invention. A plurality of unit pixels 33 are arranged on a light-receiving surface (image area) 32 of a semiconductor substrate 31 in the form of an array which is a square grid-like array in the present embodiment. A control pulse generating circuit 34 and a vertical scanning circuit 35 are formed on a side of the light-receiving surface 32, and a noise suppression circuit 36 and a horizontal scanning circuit 37 are formed along a lower edge of the light-receiving surface 32.

Global wirings 41 extending in an X-direction (horizontal direction) and global wirings 42 extending in a Y-direction (vertical direction) are laid on the light-receiving surface 32 of the MOS type solid-state image pickup apparatus 30. The global wirings 41 are connected to the control pulse generating circuit 34 and the vertical scanning circuit 35, and the wirings 42 are connected to the noise suppression circuit 36, the horizontal scanning circuit 37, and a power supply which is not shown.

Figure 2A:
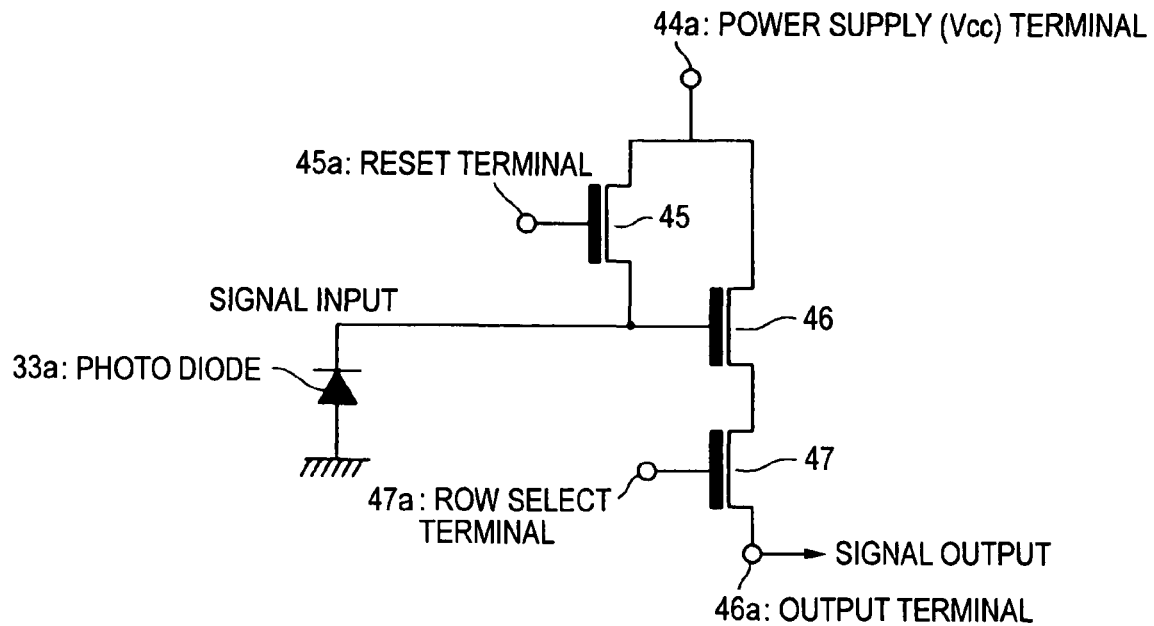
FIGS. 2A is a circuit diagram of signal reading circuit to be provided in the vicinity of the photodiode shown in FIG. 1, having the related-art 3-transistor configuration.
Figure 2B:
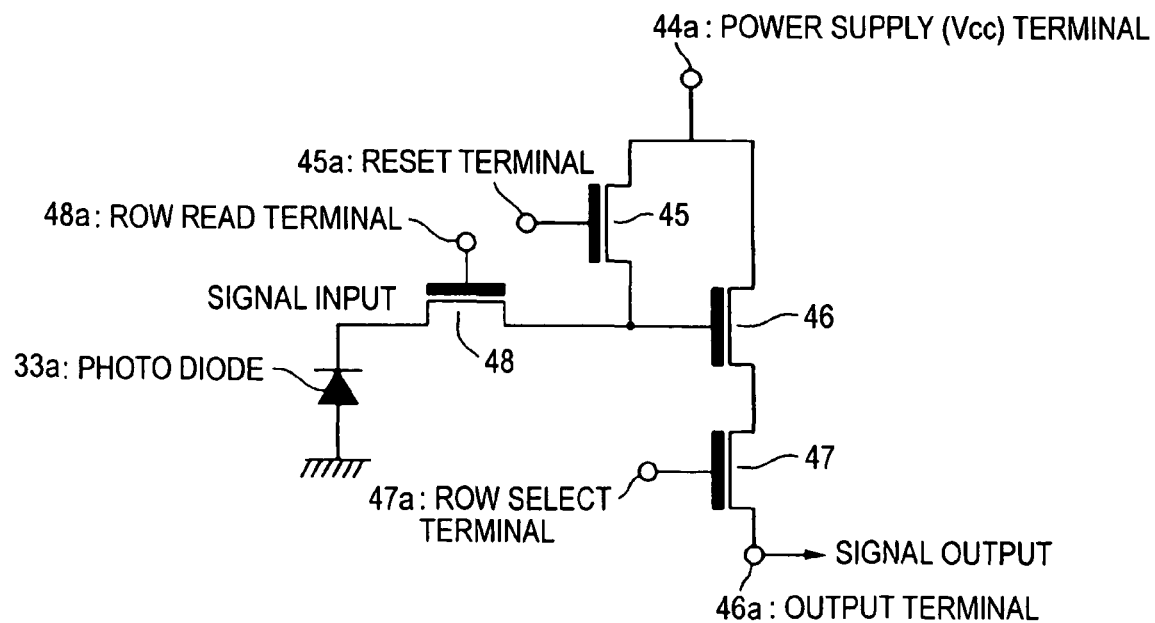
FIG. 2B is a circuit diagram of signal reading circuits to be provided in the vicinity of the photodiode shown in FIG. 1, having the related-art 4-transistor configuration.

FIGS. 2A and 2B are circuit diagrams of signal reading circuits to be provided at each of the unit pixels 33. FIG. 2A is a diagram of a signal reading circuit having a known 3-transistor configuration, and FIG. 2B is a diagram of a signal reading circuit having a known 4-transistor configuration.

The 3-transistor configuration includes a power supply terminal 44a for supplying power Vcc, a reset terminal 45a for applying a reset signal to a gate of a reset transistor 45, an output terminal 46a for outputting a signal from an output transistor 46, and a row select terminal 47a for applying a row select signal to a gate of a row select transistor 47. The 4-transistor configuration includes a row read terminal 48a for applying a row read signal to a gate of a row read transistor 48 in addition to the terminals 44a, 45a, 46a, and 47a in the 3-transistor configuration.

The global wirings 41 and 42 are laid on the light-receiving surface 32 of the semiconductor substrate to connect the terminals 44a, 45a, 46a, 47a, and 48a to the power supply, the horizontal scanning circuit 37, and the vertical scanning circuit 35.

Although FIG. 1 therefore shows that one each of the horizontal global wirings 41 and vertical global wirings 42 are laid between.

Among the global wirings, a low-resistance wiring is preferably used as a power supply line connected to the power terminal 44a to supply stable power Vcc to the signal reading circuit.

Referring to control signal lines connected to the gate electrodes of the MOS transistors constituting each signal reading circuit, i.e., a reset line connected to the reset terminal 45a, a row select line (ROW SELECT) connected to the row select terminal 47a, and a row read control line connected to the row read terminal 48a, it is required only to apply on-off signals (signals "0" and "1") to those lines to turn the transistors on and off. Therefore, the electrical resistance of those global wirings may be set within a range in which a required transistor switching speed is achieved.

For example, in the case of a DRAM, a high-resistance wiring is not used because the memory device is read at a speed on the order of nanoseconds. In the case of an image sensor, since it is read at a speed on the order of microseconds, a great margin is allowed for the specific resistance per unit length of control signal lines such as a reset line, a row select line, and a row read control line.

Figure 3:
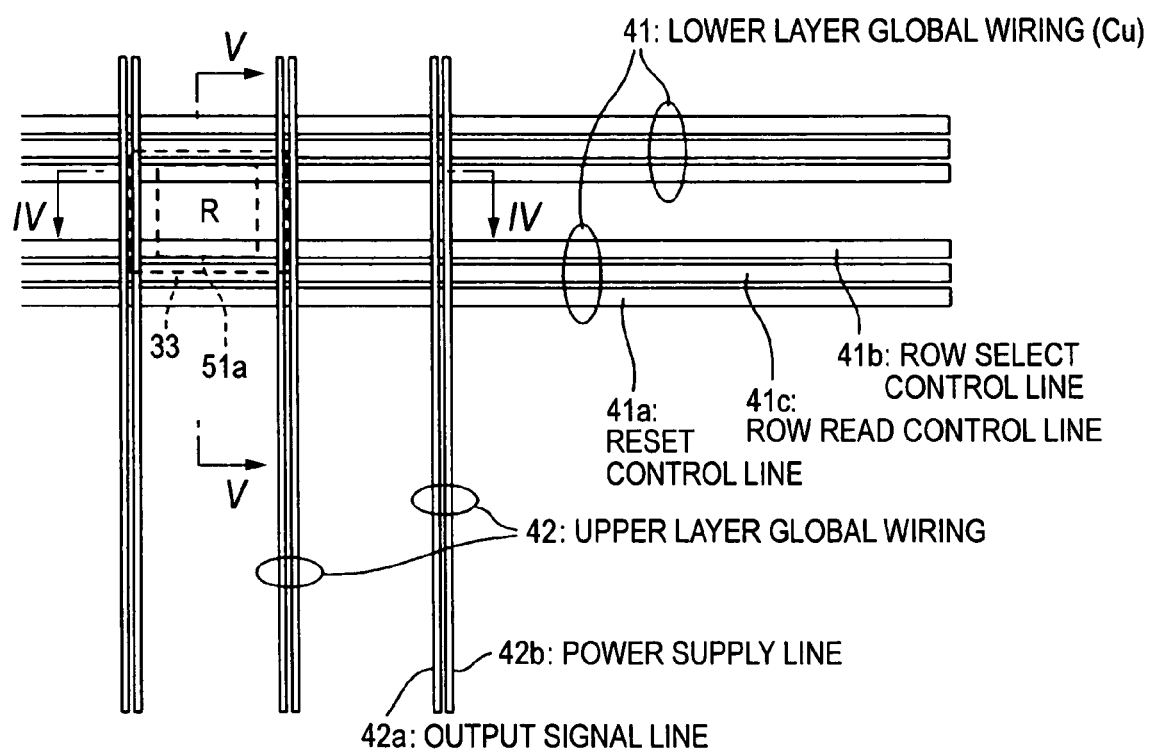
FIG. 3 is an enlarged schematic view of global wirings located in the rectangular range III indicated by a dotted line in FIG. 1.

FIG. 3 is a schematic plan view showing global wirings 41 and 42 located in the rectangular range III indicated by a dotted line in FIG. 1. A unit pixel 33 as shown in FIG. 1 is disposed in each of positions defined in the form of a grid by the global wirings 41 and 42 laid in the vertical and horizontal directions, and an opening 51a of the shield film is provided above the photodiode constituting each unit pixel.

In the MOS type solid-state image pickup apparatus 30 of the present embodiment, since a signal reading circuit has a 4-transistor configuration, the circuit is required to have five global wirings in total which are specifically a power supply line connected to the power supply terminal 44a, an output signal line connected to the output terminal 46a, a reset control line connected to the reset terminal 45a, a row select control line connected to the row select terminal 47a, and a row read control line connected to the row read terminal 48a.

In the embodiment shown in FIG. 3, a global wiring 41 laid in the X-direction (horizontal direction) is constituted by three lines, i.e., a reset control line 41a, a row select control line 41b, and a row read control line 41c, and a global wiring 42 laid in the Y-direction (vertical direction) is constituted by two lines, i.e., an output signal line 42a and a power supply line 42b.

Figure 4:
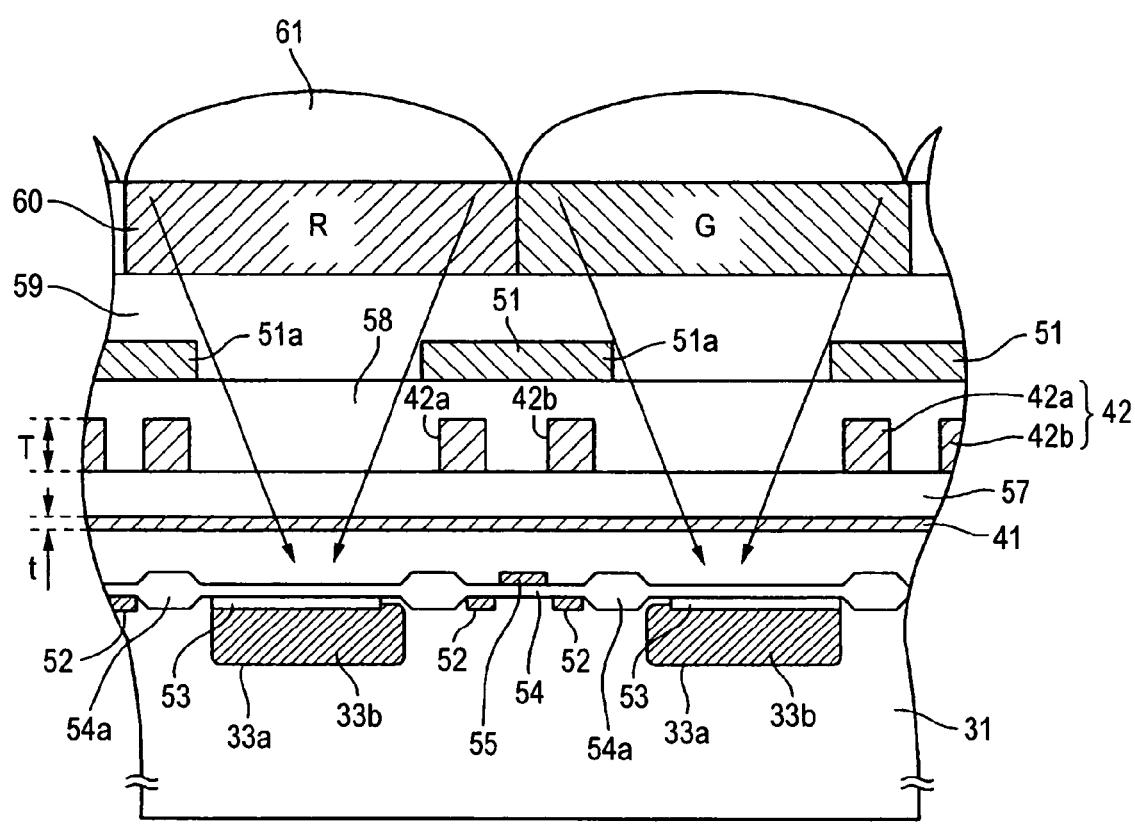
FIG. 4 is a schematic sectional view of the MOS type solid-state image pickup apparatus taken in the position of the line IV-IV in FIG. 3.
Figure 5:
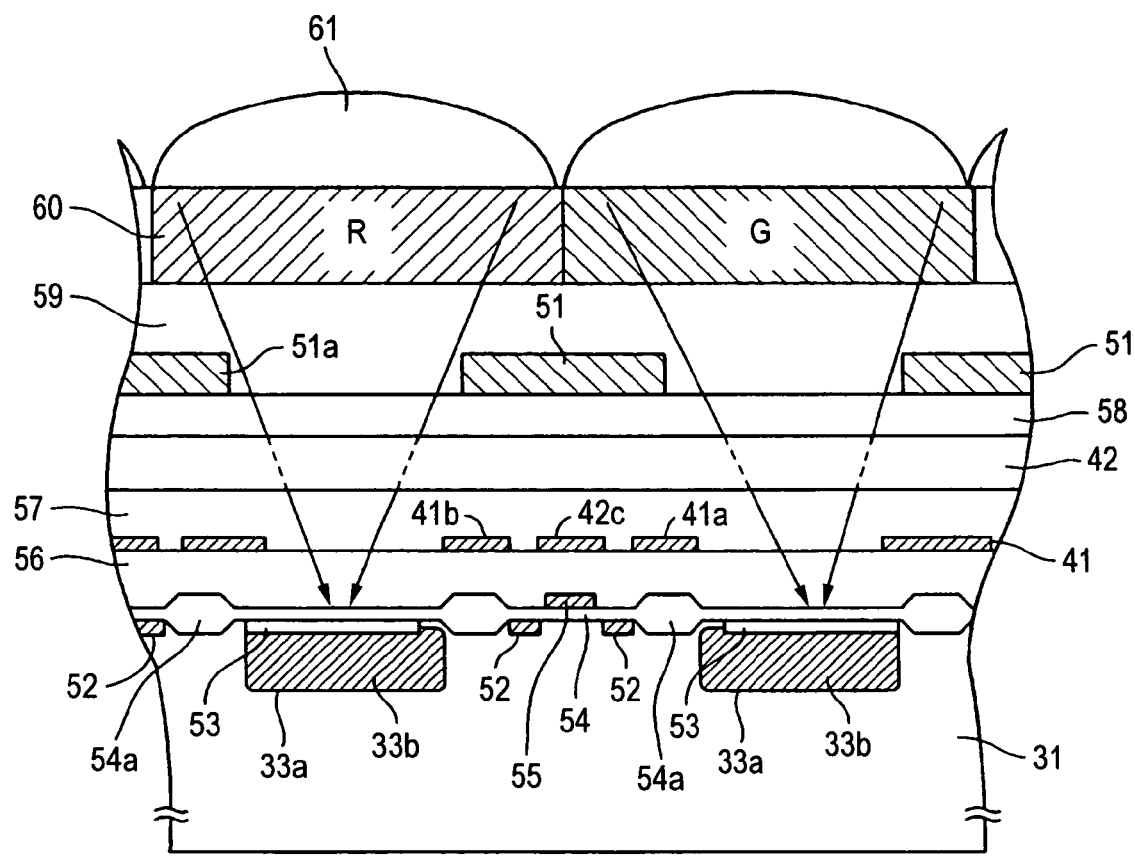
FIG. 5 is a schematic sectional view of the MOS type solid-state image pickup apparatus taken in the position of the line V-V in FIG. 3.
Figure 6A:
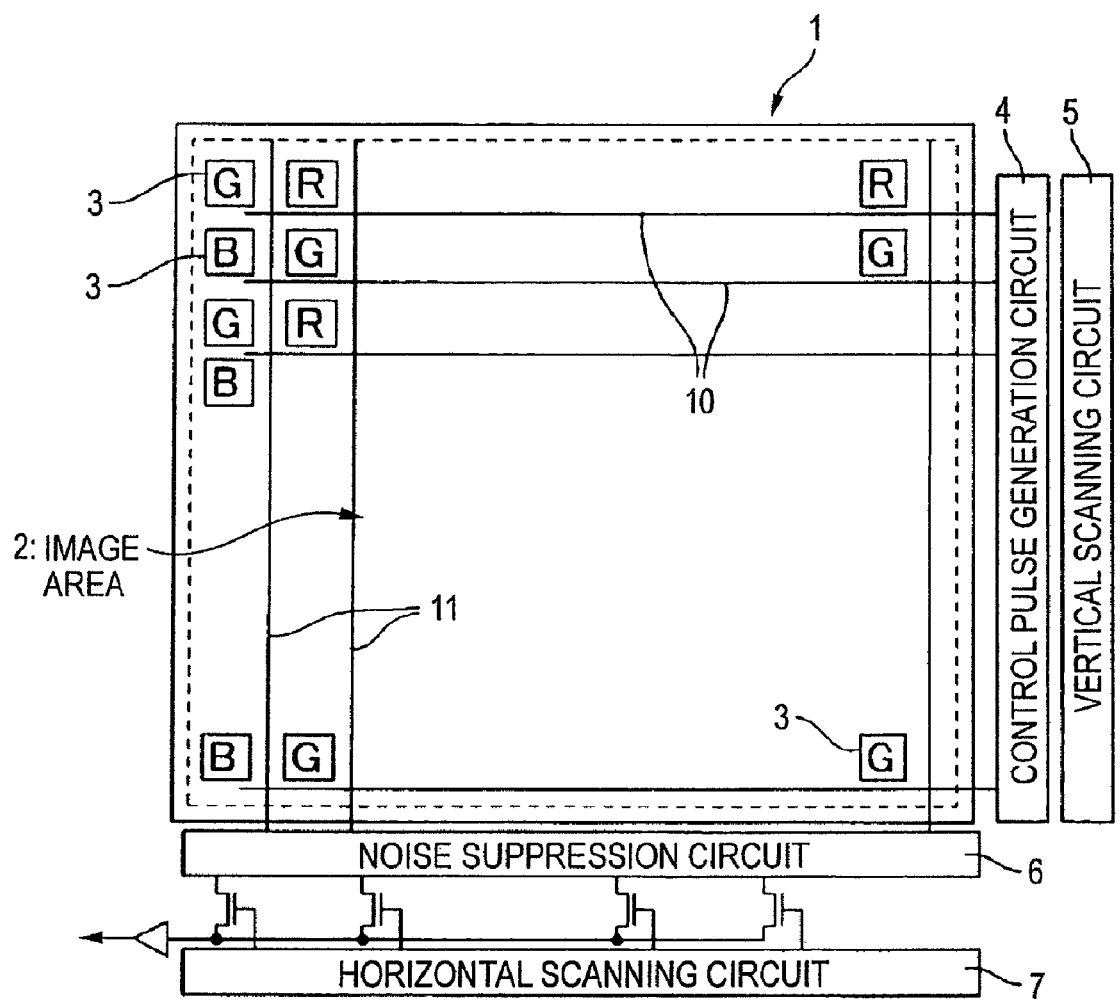
FIG. 6A is a schematic view of a surface of a MOS type solid-state image pickup apparatus having a square grid arrangement according to the related art.
Figure 6B:
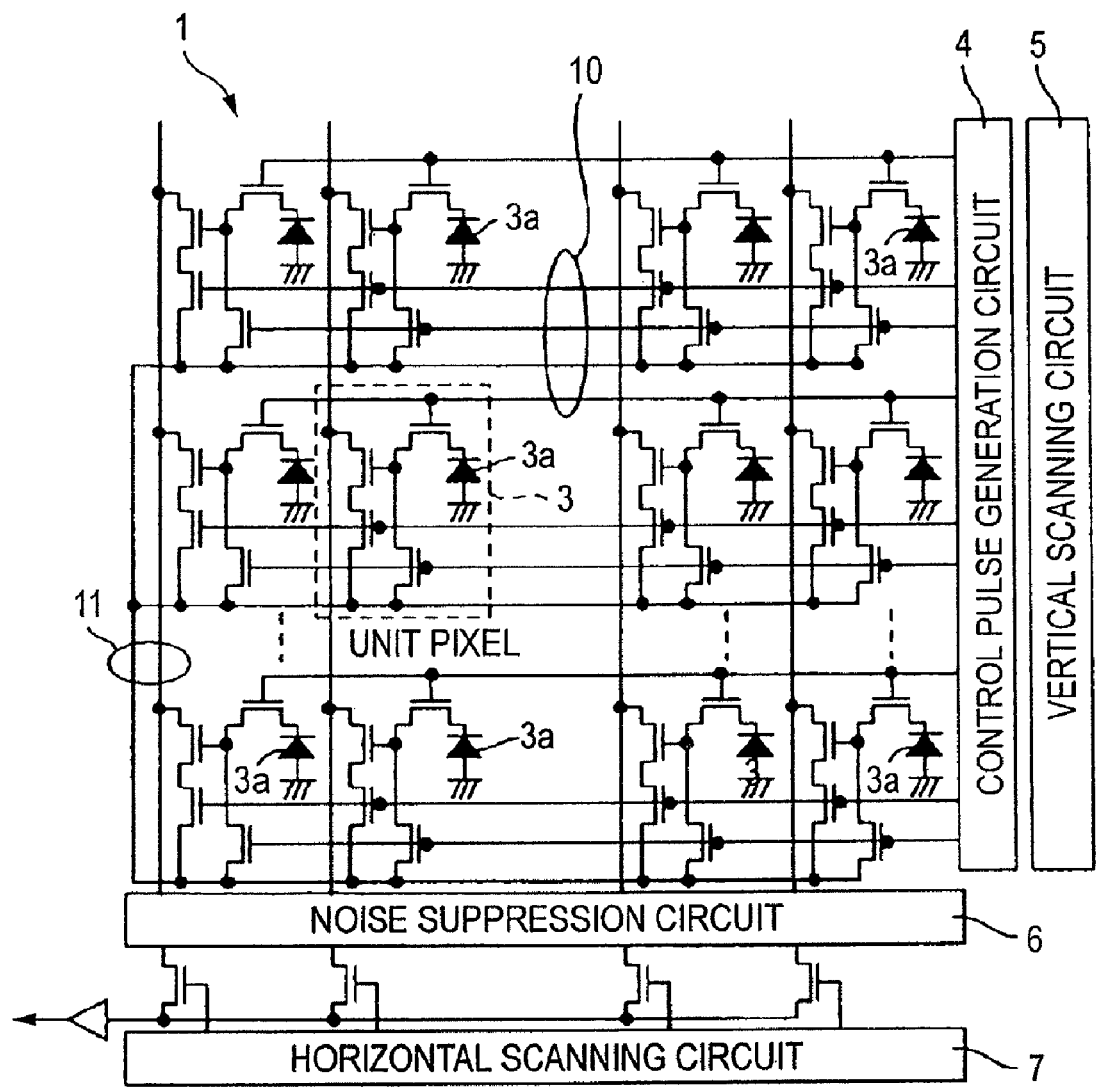
FIG. 6B is a circuit diagram of the MOS type solid-state image pickup apparatus shown in FIG. 6A.
Figure 7A:
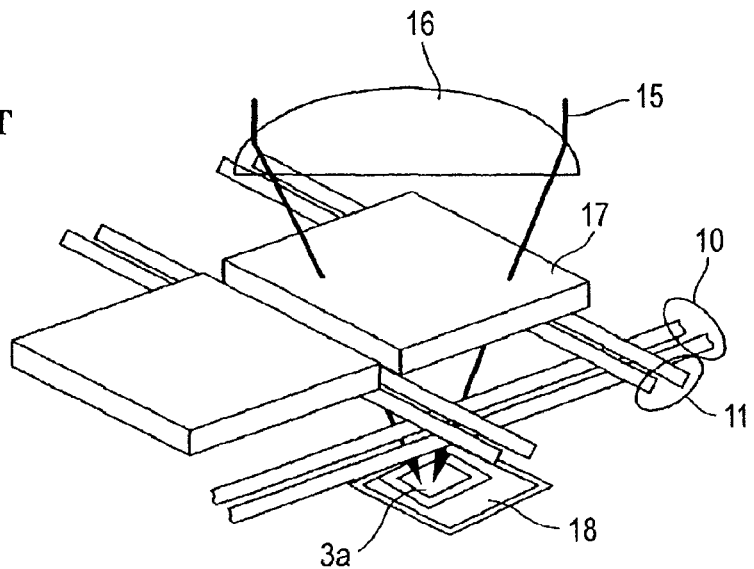
FIG. 7A is a perspective view of major parts of one of the pixels shown in FIG. 6A.
Figure 7B:
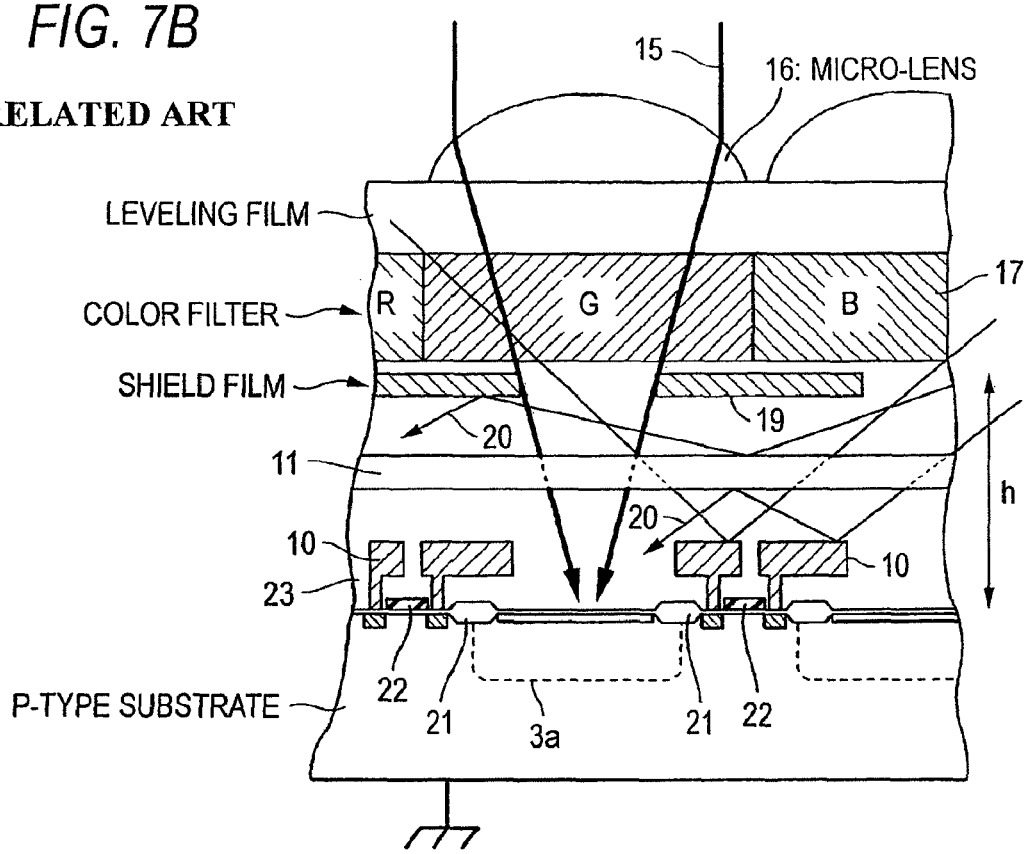
FIG. 7B is a schematic view of a section of the major parts of one of the pixels shown in FIG. 6A.

FIG. 4 is a schematic sectional view of the MOS type solid-state image pickup apparatus taken in the position of the line IV-IV shown in FIG. 3. FIG. 5 is a schematic sectional view taken in the position of the line V-V shown in FIG. 3. $N^+$-type regions 33b to constitute p-n junctions (photodiodes) 33a between the p-type semiconductor substrate 31 and themselves are formed in predetermined positions of a surface region of the p-type semiconductor substrate 31 (positions under the openings 51a of the shield film 51). $N^+$-type regions 52 to constitute the sources and drains of the MOS transistors forming part of the signal reading circuits are formed in positions of the surface region of the p-type semiconductor substrate 31 which are shielded from light by the shield film 51.

A surface $p^+$ layer 53 which is effective in reducing so-called white scratches appearing on an image pickup screen is formed on the surface of each of the $n^+$-type regions 33b, and an oxide film 54 is formed as the uppermost layer. The oxide film 54 is formed with a greater thickness in parts thereof separating the signal reading circuits and the $n^+$-regions 33b, and such parts constitute device separating regions 54a.

A gate electrode film 55 is provided between a source and a drain 52 on the oxide film 54, and a leveling film 56 is formed on the same. The gate electrode 55 is embedded in the leveling film 56. A global wiring 41 in the X-direction (the reset control line 41a, row select line 41b, and row select control line 41c) is laid on the leveling film 56. The global wiring 41, which is referred to as "lower layer global wiring", is electrically connected to the gate electrode film 55 of the MOS transistor associated therewith through a contact via which is not shown.

A leveling film 57 is formed on the global wiring 41 to embed the global wiring 41 with the leveling film 57, and a global wiring 42 in the Y-direction (an output signal line 42a and power supply line 42b) is laid. A leveling film 58 is formed on the global wiring 42 to embed the global wiring 42 with the leveling film 58, and the shield film 51 is formed on the leveling film 58. The global wiring 42, which is referred to as "upper layer global wiring" is electrically connected to the source and drain 42 of the MOS transistor associated therewith through a contact via which is not shown.

The shield film 51 has a rectangular opening 51a provided in a position aligned with each $n^+$-region 33b constituting a photodiode, and the film blocks light the incidence of light upon the global wirings 41 and 42 and the signal reading circuit.

A leveling film 59 is formed on the shield film 51 to embed the shield film 51 in the leveling film 59, and a color filter layer 60 in any of red (R), green (G), and blue (B) on each pixel (photodiode), and a micro-lens (top lens 61) is formed on the filter layer at each pixel (photodiode).

The upper layer global wirings 42 and lower layer global wirings 41 define pixels 50 in the form of a grid as shown in FIG. 3. Light incident on each pixel 50 is collected by the micro-lens 61. Since the global wirings 41 and 42 are located closer to the micro-lens 51 than the position of the focus of the micro-lens 61, the beams of light collected by the micro-lens 61 have not converged in the position of each global wiring.

The upper layer global wiring 42 must be sufficiently spaced from adjacent global wirings 42 above the photodiode 33a ($n^+$-region 33b) such that incident light is not blocked.

Since the lower layer global wiring 41 is located in a position where incident light is sufficiently converged by the micro-lens 61, the wiring is characterized in that it has a less strict limitation on the line width of the same compared to the upper global wiring 42.

When the pixel is made finer, a problem arises in that the focus of the micro-lens 61 is positioned in front of an object (front focus) and that the image forming position therefore moves upward away from the photodiode. In order to mitigate such front focusing, it is effective to form the wiring layers and layer insulation films (leveling films) with a smaller thickness.

The present embodiment confronts the problem by providing the lower layer global wirings 41 with a great line width and providing the lower layer global wirings 41 with a small thickness t (see FIG. 4) conversely. As a result, in the MOS type solid-state image pickup apparatus of the present embodiment, light can be easily converged on the photodiodes by the micro-lenses 61.

In general, when the lower layer global wirings 41 are provided with a small thickness t, the specific resistance per unit length of the wirings increases. However, the reduction of thickness can be carried out as long as it does not create any problem in circuit operations.

On the contrary, the line width of the upper layer global wirings 42 must be made as small as possible such that the wirings will not constitute any obstacle in the path of incident light. Since a decrease in the line width results in an increase in the resistance of the wirings, it is advantageous to increase the thickness T of the wirings to decrease the resistance (see FIG. 4). The reduction in the thickness T of the upper layer global wirings 42 is also expected to be advantageous in preventing leakage of light into adjoining pixels.

The next problem to be considered is how to assign the signal lines to the upper and lower layers to obtain preferable results. The signal lines are generally categorized into signal lines for transmitting digital signals and signal lines for transmitting analog signals.

In the case of a control signal line for supplying a control signal to the gate input of a MOS transistor, the control signal is a digital signal such as a 0 (Low) or 1 (High). The level of the control signal does not change even when an optical signal is detected (when an electrical charge is accumulated).

On the contrary, a power supply line or output signal line is connected to the source or drain of a MOS transistor, and the line must therefore be a signal line capable of supplying a stable power supply voltage or reading a very small analog signal with low susceptibility to noises.

Under the circumstance, in the present embodiment, those signal lines having different characteristics are separated and assigned to different layers, i.e., the upper and lower global wirings 41 and 42. Specifically, the control signal lines (reset control lines 41*a*, row select control lines 41*b*, and row read control lines 41*c*) are assigned to the lower layer, and the output signal lines 42*a* and the power supply lines 42*b* are assigned to the upper layer.

As a result, the solid-state image pickup devices of the MOS type solid-state image pickup apparatus of the present embodiment have improved optical characteristics, and it is therefore possible to obtain an output signal which is not adversely affected by noises.

The upper layer global wirings 42 are formed from, for example, an Al (aluminum) type electrode material, and the lower layer global wirings 41 are formed from a Cu (copper) type electrode material. Referring to the formation of Cu wiring layers, it is preferable to use an electrode forming and leveling technique utilizing CMP or what is called Cu damascene technique for the purpose of achieving a small electrode thickness and providing leveled surfaces.

Preferably, the line width of the upper layer global wirings 42 is smaller than that of the lower layer global wirings 41, and the thickness of the upper layer global wirings 42 is greater than that of the lower layer global wirings 41. As a result, the upper layer global wirings 42 have a vertically elongated sectional shape as shown in FIG. 4.

The reason for using Al as the material of the upper layer global wirings 42 is that the specific resistance of Al is lowest among those of electrode materials which can be used in semiconductor processing. As a result, an advantage is provided in that the global wirings 42 can be provided with a low electrical resistance and can be less susceptible to noises from the substrate.

Since operations involved are at a speed of 50 MHz at the highest unlike those in general-purpose logic circuits (whose CPUs are at speeds on the order of GHz), a delay attributable to an increase in resistive components of the global wirings 41 (e.g., a reduction in the thickness of Cu electrodes) can be tolerated as long as it does not create any problem in operations.

The MOS type solid-state image pickup apparatus of the above-described embodiments can provide the following advantages.

(1) The global wirings are separated into a group of control signal lines and a group of power supply lines, and the group of control signal lines and the group of power supply lines are aligned to the lower and upper layers, respectively. Thus, the specific resistance per unit length of the global wirings can be set with an increased degree of freedom, which allows the converging optical systems above the photodiodes to be easily designed.

(2) Since the micro-lenses can be put close to the photodiodes, the optical path between them can be short, which mitigates losses attributable light absorption and multiple reflections and also improves sensitivity. Further, the image forming position of the micro-lenses will not be front-focused even if the pixels are made finer.

(3) Since the lower layer global wirings are leveled, the signal lines, color filters, and the micro-lenses formed above the same are patterned with improved accuracy, which allows finer products to be easily provided at improved yield.

According to the invention, the thickness of a region formed in layers on a surface of a semiconductor substrate can be reduced to shorten the distance between a micro-lens (top lens) and a light-receiving portion. As a result, multiple reflections of straight light included in incident light can be suppressed to allow an image of high quality to be picked up.

In a MOS type solid-state image pickup apparatus according to the invention, any reduction in image quality attributable to reflections of incident light on global wirings can be suppressed. The apparatus can therefore be advantageously used as a MOS type solid-state image pickup apparatus which can be loaded in a digital camera for taking images of high quality.

The entire disclosure of each and every foreign patent application from which the benefit of foreign priority has been claimed in the present application is incorporated herein by reference, as if fully set forth.

What is claimed is:

1. A MOS type solid-state image pickup apparatus comprising:
   a semiconductor substrate having a light receiving surface;
   a plurality of photoelectric conversion elements arranged in an array manner on the light receiving surface;
   a plurality of layers of wirings that goes across the light receiving surface and are stacked above the semiconductor substrate; and
   an insulation layer interposed with the layers of wirings,
   wherein a first wiring in a lower one of the layers of wirings has a greater line width and a smaller thickness compared to a second wiring in an upper one of the layers of wirings.

2. The MOS type solid-state image pickup apparatus according to claim 1,
   wherein a sectional shape of the second wiring taken in a direction perpendicular to a longitudinal direction of the second wiring is vertically elongated when the vertical direction is a direction extending upward from the semiconductor substrate.

3. The MOS type solid-state image pickup apparatus according to claim 1, wherein the wirings are connected to signal reading circuits each of which is provided in association with each of the photoelectric conversion elements, the first wiring connects to a gate of a MOS transistor forming a part of each of the signal reading circuits, and the second wiring connects to a source or drain of the MOS transistor.

4. The MOS type solid-state image pickup apparatus according to claim 1, wherein a specific resistance per unit length of the second wiring is lower than a specific resistance per unit length of the first wiring.

5. The MOS type solid-state image pickup apparatus according to claim 1, wherein a material of the second wiring is Al or a compound including Al.

6. The MOS type solid-state image pickup apparatus according to claim 1, wherein a material of the first wiring is Cu or a compound including Cu.

7. A MOS type solid-state image pickup apparatus comprising:

a semiconductor substrate having a light receiving surface;

a plurality of photoelectric conversion elements arranged in an array manner on the light receiving surface;

a plurality of layers of wirings that goes across the light receiving surface and are stacked above the semiconductor substrate, the wirings being connected to signal reading circuits each of which is provided in association with each of the photoelectric conversion elements; and an insulation layer interposed with the layers of wirings, wherein a first wiring, which connects to a gate of a MOS transistor forming a part of each of the signal reading circuits, is provided in a lower one of the layers of wirings, and a second wiring, which connects to a source or drain of the MOS transistor, is provided in an upper one of the layers of wirings, wherein the second wiring includes a plurality of power supply lines, and each of the plurality of power supply lines is disposed in a vertical direction, and wherein the first wiring has a greater line width and a smaller thickness compared to the second wiring.

8. The MOS type solid-state image pickup apparatus according to claim 7, wherein a sectional shape of the second wiring taken in a direction perpendicular to a longitudinal direction of the second wiring is vertically elongated when the vertical direction is a direction extending upward from the semiconductor substrate.

9. The MOS type solid-state image pickup apparatus according to claim 7, wherein a specific resistance per unit length of the second wiring is lower than a specific resistance per unit length of the first wiring.

10. The MOS type solid-state image pickup apparatus according to claim 7, wherein a material of the second wiring is Al or a compound including Al.

11. The MOS type solid-state image pickup apparatus according to claim 7, wherein a material of the first wiring is Cu or a compound including Cu.

12. The MOS type solid-state image pickup apparatus according to claim 7, wherein each of the plurality of power supply lines is disposed along one of the plurality of photoelectric conversion elements being arranged in the vertical direction.

\* \* \* \* \*